United States Patent [19]
Anderson

[11] Patent Number: 5,371,469
[45] Date of Patent: Dec. 6, 1994

[54] CONSTANT CURRENT LOOP IMPEDANCE MEASURING SYSTEM THAT IS IMMUNE TO THE EFFECTS OF PARASITIC IMPEDANCES

[75] Inventor: Karl F. Anderson, Lancaster, Calif.

[73] Assignee: The United States of America as represented by the Administrator of the National Aeronautics and Space Administration, Washington, D.C.

[21] Appl. No.: 18,128

[22] Filed: Feb. 16, 1993

[51] Int. Cl.$^5$ .................... G01R 27/02; G01L 1/22; G01K 7/20
[52] U.S. Cl. .................... 324/705; 324/706; 324/713; 324/601; 324/130; 73/862.628
[58] Field of Search ............... 324/656, 657, 672, 673, 324/679, 680, 704, 705, 706, 713, 601, 130; 73/720, 726, 862.627, 862.628, 862.68, 862.045; 338/2, 3; 374/183

[56] References Cited

U.S. PATENT DOCUMENTS

| | | | |
|---|---|---|---|
| 3,403,558 | 10/1968 | Elliott | 338/3 X |
| 3,439,258 | 4/1969 | Van Leeuwen | |
| 3,535,637 | 10/1970 | Goransson | |
| 3,566,261 | 2/1971 | Fenelon et al. | |
| 4,041,382 | 8/1977 | Washburn | |
| 4,081,744 | 3/1978 | Ray | 324/601 |
| 4,169,243 | 9/1979 | Payne et al. | |
| 4,213,348 | 7/1980 | Reinertson et al. | |
| 4,398,145 | 8/1983 | Quayle | 324/705 |
| 4,808,914 | 2/1989 | Talmor | 324/705 |
| 4,841,229 | 6/1989 | Eccleston | |
| 5,122,756 | 6/1992 | Nelson | 324/706 |

Primary Examiner—Gerard R. Strecker
Assistant Examiner—Diep Do
Attorney, Agent, or Firm—Darrell G. Brekke; Guy M. Miller; John R. Manning

[57] ABSTRACT

A constant current loop measuring system is provided for measuring a characteristic of an environment. The system comprises a first impedance positionable in the environment, a second impedance coupled in series with said first impedance and a parasitic impedance electrically coupled to the first and second impedances. A current generating device, electrically coupled in series with the first and second impedances, provides a constant current through the first and second impedances to produce first and second voltages across the first and second impedances, respectively, and a parasitic voltage across the parasitic impedance. A high impedance voltage measuring device measures a voltage difference between the first and second voltages independent of the parasitic voltage to produce a characteristic voltage representative of the characteristic of the environment.

18 Claims, 5 Drawing Sheets

CONSTANT CURRENT LOOP IMPEDANCE MEASURING SYSTEM THAT IS IMMUNE TO THE EFFECTS OF PARASITIC IMPEDANCES

The invention described herein was made by an employee of the United States Government and may be manufactured and used by or for the Government for governmental purposes without the payment of any royalties thereon or therefor.

BACKGROUND OF THE INVENTION

1. Technical Field of the Invention

This invention relates to a constant current loop measuring system for generating measurable voltages across a resistor disposed in an environment and a reference resistor and determining a difference between these voltages to calculate a change in the voltage across the resistor disposed in the environment, this change representing a predetermined condition of the environment.

2. Description of the Prior Art

When performing scientific experiments, it is imperative that measurements taken during these experiments are as accurate as possible. When measuring a characteristic or a change in a characteristic of an environment, it is common to dispose in the environment a resistor whose resistance varies in proportion with the characteristic of the environment being measured.

It is common to use such a resistor as part of a Wheatstone bridge system. A Wheatstone bridge is a two-branched voltage divider network usually consisting of three fixed resistors and a variable resistor. The variable resistor is disposed in the environment to measure the predetermined characteristic. A current is passed through the resistors and a voltage difference or current difference appearing at the output of the Wheatstone bridge is measured. This voltage or current difference is proportional to the change in the variable resistor due to the predetermined characteristic. The magnitude of the predetermined characteristic is then calculated based on this voltage or current change.

A problem that exists in using a Wheatstone bridge is the existence of parasitic resistances throughout the Wheatstone bridge system. These parasitic resistances are due to the connecting wires or additional components such as slip rings, etc., which couple the resistors together. The parasitic resistances generate parasitic voltages when current is passed through the resistors in the Wheatstone bridge. These parasitic voltages can cause erroneous voltage or current differences to appear at the output of the Wheatstone bridge and therefore cause inaccurate measurements. Furthermore, these parasitic resistances may vary due to thermal, mechanical, chemical or other conditions of the environment and thus, it is extremely difficult to provide circuitry to compensate for these parasitic resistances.

Examples of circuits known in the art which attempt to eliminate the effect of parasitic resistances are four-wire Kelvin circuits or a circuit which connects three wires to the remote variable resistor disposed in the environment. This three wire circuit attempts to electrically subtract the parasitic resistance variations in each of the current carrying leads connected to the variable resistor. The subtraction is effected by connecting the leads to adjacent arms of the Wheatstone bridge so that the parasitic resistances effectively cancel each other at the output of the Wheatstone bridge.

This approach is effective in moderate temperature environments but causes the measurement system to be less sensitive due to the increase in circuit resistance caused by the lead wires. Also, because the wires and associated components are not identical, in severe temperature environments, the parasitic resistances vary. This results in an unreliable output and inaccurate measurements.

Another method for reducing the effect of parasitic resistances in the Wheatstone bridge or Kelvin circuit is to pass a constant current through the Wheatstone bridge or Kelvin circuit. This approach satisfactorily reduces the parasitic effect of the wiring connecting the constant current source to the Wheatstone bridge or Kelvin circuit. But, this approach does not reduce the effects of the parasitic voltages caused by the parasitic resistances within the Wheatstone bridge or Kelvin circuit.

There are other problems that occur when using Wheatstone bridge circuits. One is that the variations in voltage output are very small in comparison to the voltage drop across the arms of the Wheatstone bridge circuit. That is, for example, the voltage across each arm of the Wheatstone bridge can be several volts while the variation voltage due to the resistance change caused by the predetermined characteristic in the environment is usually on the order of several millivolts. Another is that the electrical output (either voltage or current) of the Wheatstone bridge circuit is always a nonlinear function of the resistance change of the variable resistor. This non-linearity characteristic causes the data processing necessary for determining the value of the environmental characteristic in proportion with this voltage or current variation to be more complex. Furthermore, the output of a Wheatstone bridge circuit is a function of the internal resistances of the circuit and not a function of the change in the variable resistor alone. This makes calibration more difficult.

It is therefore necessary and desireable to develop a measurement system having a reliable output that is unaffected by parasitic resistances that may exist in the system. Furthermore, it is also beneficial that the output of the system be linear thus simplifying the data processing necessary to calculate the change in environmental characteristic based on the change in output voltage or current.

SUMMARY OF THE INVENTION

It is an object of the present invention to provide a system for accurately measuring the characteristic of an environment such that the measurements are unaffected parasitic voltages caused by parasitic resistances in the system.

It is further an object of the present to provide a system having an output that varies linearly in proportion with a variation in the characteristic of the environment.

To achieve these and other objects, an embodiment of the present invention provides a constant current loop measuring system for measuring a characteristic of an environment comprising a first impedance positionable in the environment, a second impedance coupled in series with the first impedance, a parasitic impedance electrically coupled to the first and second impedances and a current device, electrically coupled in series with the first and second impedances, for providing a constant current through the first and second impedances to produce first and second voltages across the first and second impedances, respectively, and a parasitic voltage across the parasitic impedance. The measuring system further comprises voltage measuring means for measuring a voltage difference between the first and second voltages independent of the parasitic voltage to produce a characteristic voltage representative of the characteristic of the environment.

In an embodiment of the present invention, the voltage measuring means comprises first and second amplifying means for independently measuring the first and second voltages, respectively, and third amplifying means, electrically coupled to the first and second amplifying means, for differencing the first and second voltages to provide the characteristic voltage. The voltage measuring means in another embodiment of the measuring system comprises flying capacitor multiplexing means electrically coupled to the first and second impedances, for differencing the first and second voltages to provide a difference voltage and first amplifier means, electrically coupled to the first impedance and the flying capacitor multiplexing means, for amplifying the difference voltage to provide the characteristic voltage.

Another embodiment of the voltage measuring means comprises further combinations of instrumentation amplifiers. Still another embodiment of the voltage measuring means comprises a data current generating circuit.

Additional objects and advantages of the invention will be set forth in the description which follows, and in part will from the description, or may be learned by practice of the invention. The objects and advantages of the invention may be realized by means of the instrumentalities and combinations particularly pointed out in the appended claims.

DETAILED DESCRIPTION OF THE PREFERRED EMBODIMENTS

Figure 1:
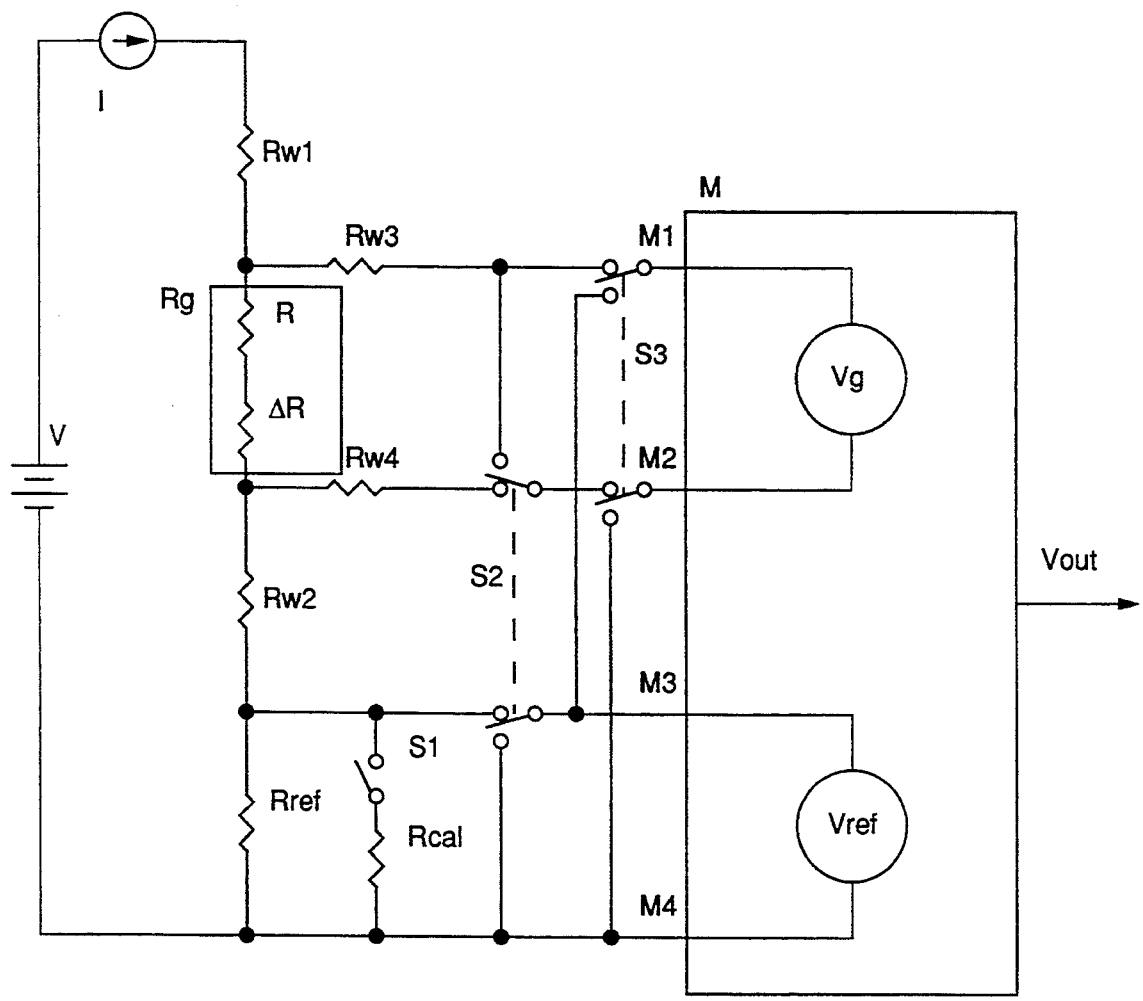
FIG. 1 is a schematic diagram of an embodiment of the constant current loop measuring system of the present invention.

An embodiment of the present invention provides a constant current loop measuring system as shown schematically in FIG. 1. A single series current loop comprises a voltage source V and a constant current regulator I which maintains the current (e.g., 10 mA) at an essentially constant level within a predetermined range regardless of the value of the impedances in the current loop series circuit. Parasitic impedances Rw1, Rw2, Rw3, and Rw4 are present throughout the measuring system as illustrated and are due to, for example, the impedances in the lead wires, connections between the components of the system, fault protection circuit elements. For simplicity, such impedances will be referred to as "lead wire impedances".

A single transducer impedance, e.g. a strain gauge or a temperature sensitive impedance, such as Rg is coupled in series with the constant current regulator I. This transducer impedance Rg is illustrated as having an initial impedance value R or, for example, 120 or 350 ohms in series with a variable impedance value $\Delta R$ which varies in proportion with the characteristic of the environment being measured. A reference impedance Rref is coupled in series with the transducer impedance Rg and is further coupled to the voltage source V. A high input impedance voltage difference measuring system M is electrically coupled to the constant current loop. The voltage difference measuring system M comprises four input leads each having a high impedance on the order of ten megaohms or greater.

Input terminal M1 is coupled to the constant current loop between the constant current regulator and the transducer impedance. Input terminal M2 is coupled to the constant current loop between the transducer impedance Rg and the reference impedance Rref. Input terminal M3 is coupled to the constant current loop between the transducer impedance Rg and the reference impedance Rref. Input terminal M4 is coupled to the constant current loop between the reference impedance Rref and the voltage source V.

The voltage drop Vg across transducer impedance Rg is measured at terminals M1 and M2 by the voltage difference measuring system M. The voltage difference the Vref across the reference impedance are measured at input terminals M3 and M4 by the voltage difference measuring system M. Because the impedance of the input terminals M1 through M4 is very high, virtually no current flows into these input terminals and therefore virtually no parasitic voltage is generated across parasitic resistances Rw3 and Rw4. Also, virtually no parasitic voltage is generated at the connections of M3 and M4 to the current loop system.

The output voltage Vout of the voltage difference measuring system M is equal to the difference of the two input voltages Vg and Vref multiplied by voltage amplification factor G (e.g. 100–1000) as illustrated in equation 1 as follows:

$$Vout = (Vg - Vref) G \qquad (1).$$

Voltage drop $Vg = (R + \Delta R) I$ can be measured accurately in the presence of large and/or varying lead wire impedances Rw3 and Rw4. The voltage Vout is linear and can be further illustrated by equation 2 as follows:

$$Vout = [\Delta R + (R - Rref)](I)(G) \qquad (2).$$

Because the current provided the constant current regulator I is constant, neither voltage Vg across transducer Rg nor voltage Vref across the reference impedance Rref are affected by any other impedances such as lead wire impedances which may cause parasitic voltages in the current loop. The output voltage Vout is therefore a linear function of the impedance transducer Rg. Also, the output voltage Vout is greater than (e.g. double) the output voltage of a Wheatstone bridge circuit employing a similar transducer impedance and excitation power dissipated in the transducer impedance.

The zero offset, that is, the initial stable output Vout can be made arbitrarily small by selecting or adjusting the impedance value of the reference impedance Rref to be essentially equal to the initial value R of the transducer in impedance Rg.

The overall measurement system sensitivity is obtained by inducing a known impedance reduction impedance ΔRcal in the reference impedance Rref. This is performed by coupling a calibration impedance Rcal having a value, for example, of 5 k ohms to 50 k ohms (e.g. 50 to 200 times the impedance of Rref) in parallel with reference impedance Rref when switch S1 is closed. Switch S1 can be a mechanical switch, power MOSFET switch or the like. Both the calibration impedance Rcal and reference impedance Rref are fixed resistors in a controllable environment. The known resistance reduction ΔRcal can be represented by the following equation (3):

$$\Delta Rcal = Rref - [(Rref)(Rcal)/(Rref + Rcal)] \qquad (3).$$

This calibration induces a known change in impedance similar to the unknown change in impedance ΔR of the transducer impedance Rg. That is, during this stable calibration condition, ΔR=ΔRcal. Also, because the current is regulated to be constant by the constant current regulator I, the calibration output magnitude is not a function of the transducer impedance or of any parasitic impedance in the circuit loop. Hence, this measurement system calibration indication is a function of only ΔR (ΔRcal), the current produced by the constant current regulator I and the amplification factor G.

This system is also capable of determining whether any electrical noise is induced in the measurement system. That is, when the current provided by the constant current regulator I is zero, the voltages Vg, Vref and therefore Vout are all zero unless energy is induced in the measurement system through, for example, electrostatic coupling, electromagnetic coupling, thermal gradience crossing discontinuities in the system causing thermally induced electrical potentials. Mechanical energy can also develop unwanted electrical currents in the system. That is, for example, changes in the spacing between conductors may act as a variable capacitor holding a constant charge which can vary the voltage sensed by the system.

Induced energy (voltage or current) can be detected by activating the poles of switch S2 at the inputs to the voltage difference measuring system M. Switch S2 can be a mechanical switch, power MOSFET switch or the like. When the poles of switch S2 are activated, the inputs M1 and M2 are shorted together, and inputs M3 and M4 are shorted together. This provides a zero difference between terminals M1 and M2, and between M3 and M4. Hence, because terminal M1 is coupled via constant current regulator I to a terminal of V and terminal M4 is coupled to the opposite terminal of V, terminal group M1 and M2 and terminal group M3 and M4 are held at the extremes (i.e. opposite ends) of the total voltage difference caused by the constant current and any additional common mode effects that the transducer impedance and wiring may add to the system. Any non-zero output at Vout is therefore caused by common mode rejection problems or malfunction in the voltage difference measurement system M.

A direct indication of the ability of the voltage difference measuring system M to accurately subtract voltages is obtained by simultaneously activating the poles of switch S3 which parallel the Vg input with the Vref input. Switch S3 can be a mechanical switch, power MOSFET switch or the like. This action causes the input group of terminals M1 and M2 and the input group of terminals M3 and M4 to be at the same voltage Vref, respectively. Any non-zero indication at Vout in this situation is caused by either gain differences, offset problems, a malfunction in the voltage difference measuring system or the like.

Figure 2:
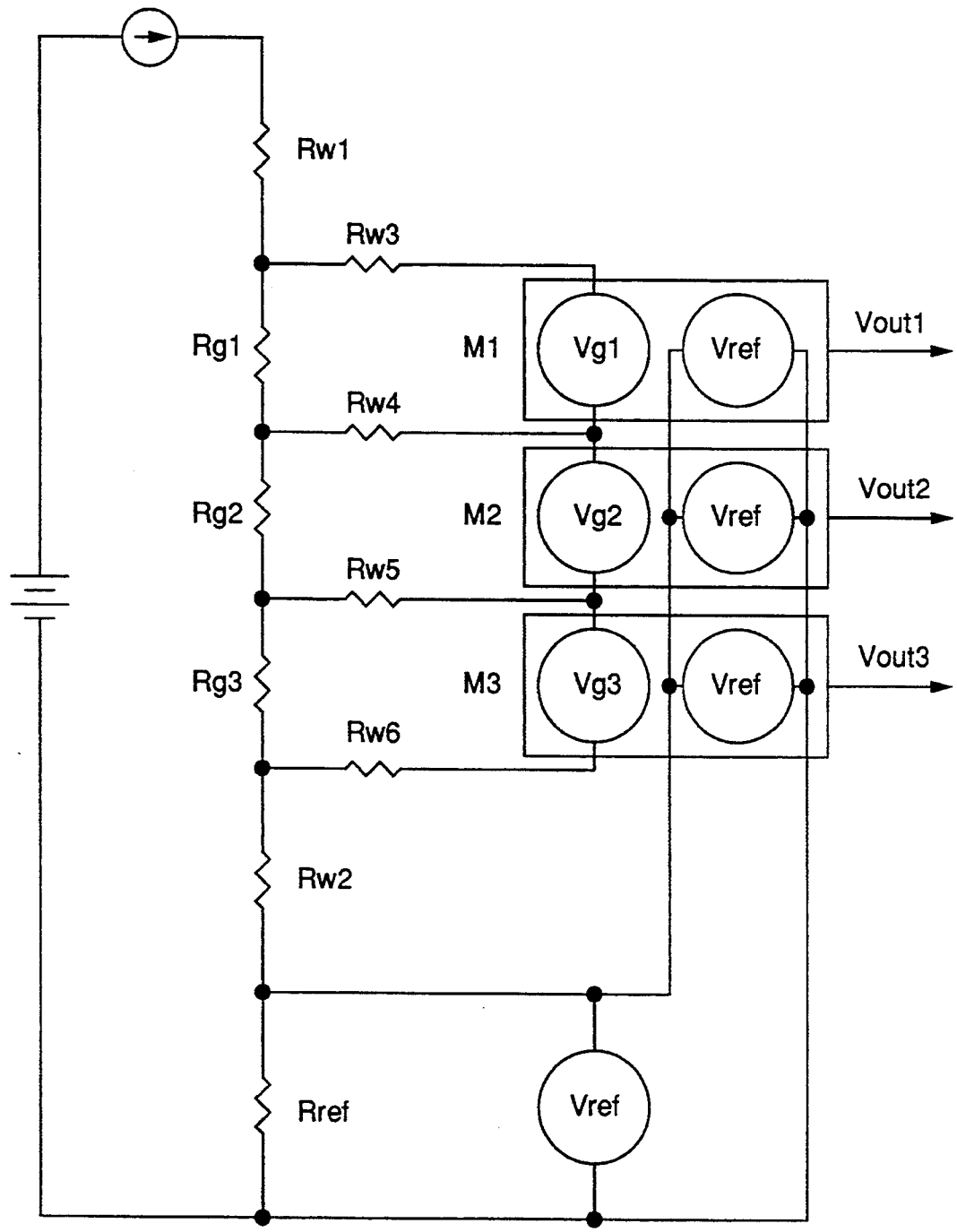
FIG. 2 is a schematic diagram of another embodiment of the constant current loop measuring system of the present invention having multiple variable impedances.

As shown in FIG. 2, more than one impedance transducer can be included in the current loop system. A separate voltage difference measuring system M can be coupled to each transducer. The Vref terminals of each voltage difference measuring system are paralleled and coupled across impedance Rref. Therefore, in this embodiment, fewer lead wires are required. Alternatively, one of the impedance transducers Rg1, Rg2 or Rg3 in the current loop can be disposed in a stable environment to serve as the reference impedance Rref. Also, because the current is constant in all sections of the constant current loop, the various elements in the constant current loop may be arranged in any order.

For simplicity, this invention is described in terms of direct voltage and current. Alternating current (AC current) can also be used to, for example, achieve noise reduction. The noise reduction is obtained by applying an alternating voltage across the transducer impedance and reference impedance that has a frequency significantly different than the noise frequency. Basically, this approach translates data energy that is originally in the same band as noise energy to another frequency band centered around the frequency of the applied voltage. The data energy can be recovered by using known bandpass filtering and phase sensitive demodulation.

Figure 3:
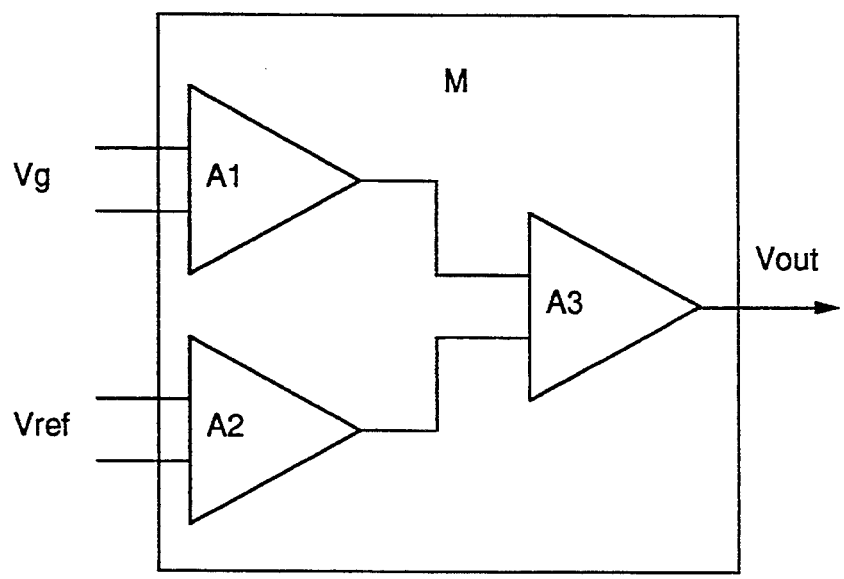
FIG. 3 is a schematic diagram of an embodiment of the voltage difference measuring system of the present invention.

An embodiment of the high input impedance voltage difference measuring system M is shown in FIG. 3. In this embodiment, the voltage difference measuring system M comprises two instrumentation amplifiers A1 and A2 arranged to sense two independent differential voltages at different common mode voltages. That is, the first instrumentation amplifier A1 is coupled to the transducer impedance Rg. The input terminals of the instrumentation amplifier correspond to the input terminals M1 and M2 of the voltage difference measuring system M. The input terminals of instrumentation amplifier A2 correspond to the input terminals M3 and M4 of the voltage difference measuring system and are coupled to the reference impedance Rref.

The outputs of the instrumentation amplifiers A1 and A2 are coupled to the input terminals of a subtracting amplifier A3. The gains and offsets of these amplifiers are adjusted to yield an output which is the amplified difference of the independent voltage inputs Vg and Vref to the voltage difference measuring system M. The analog output of the voltage difference measuring system may be converted to digital form by an analog/digital convertor (not shown) for input to a digital computer (not shown) by any suitable circuitry as a matter of standard practice in the electrical measurement art.

Figure 4:
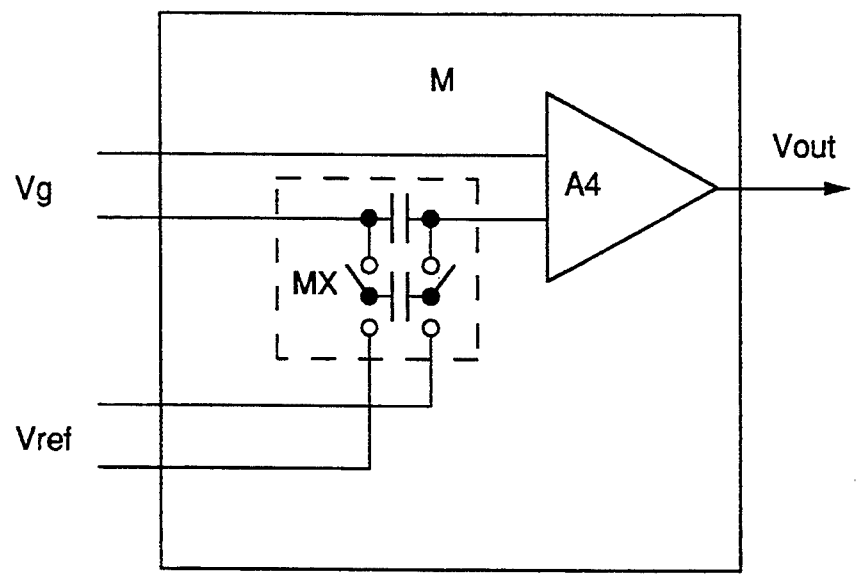
FIG. 4 is a schematic diagram of another embodiment of the voltage difference measuring system of the present invention using a flying capacitor multiplexer.

Another embodiment of the voltage difference measuring system M is illustrated in FIG. 4. This voltage difference measuring system M comprises a flying capacitor multiplexer Mx (e.g., having 0.1 μf capacitance) internally driven by a cyclic command signal and single instrumentation amplifier A4. Amplifier A4 is coupled to the impedance transducer Rg and senses the voltage Vg in series with a voltage equal to the steady reference voltage Vref transferred in an isolated manner by capacitor multiplexer Mx. That is, capacitor multiplexer Mx accepts an electrical charge from Vref and delivers this electrical potential in series with one input connection to the instrumentation amplifier A4. The output of amplifier A4 is the amplified difference between the two independent potential differences Vg and Vref that are summed before being provided to the input of the instrumentation amplifier A4. Again, the analog output of the voltage difference measuring system may be converted to digital form for input to the digital computer (not shown) or the like by any suitable circuitry as a matter of standard practice in the electrical measurement art.

Figure 5:
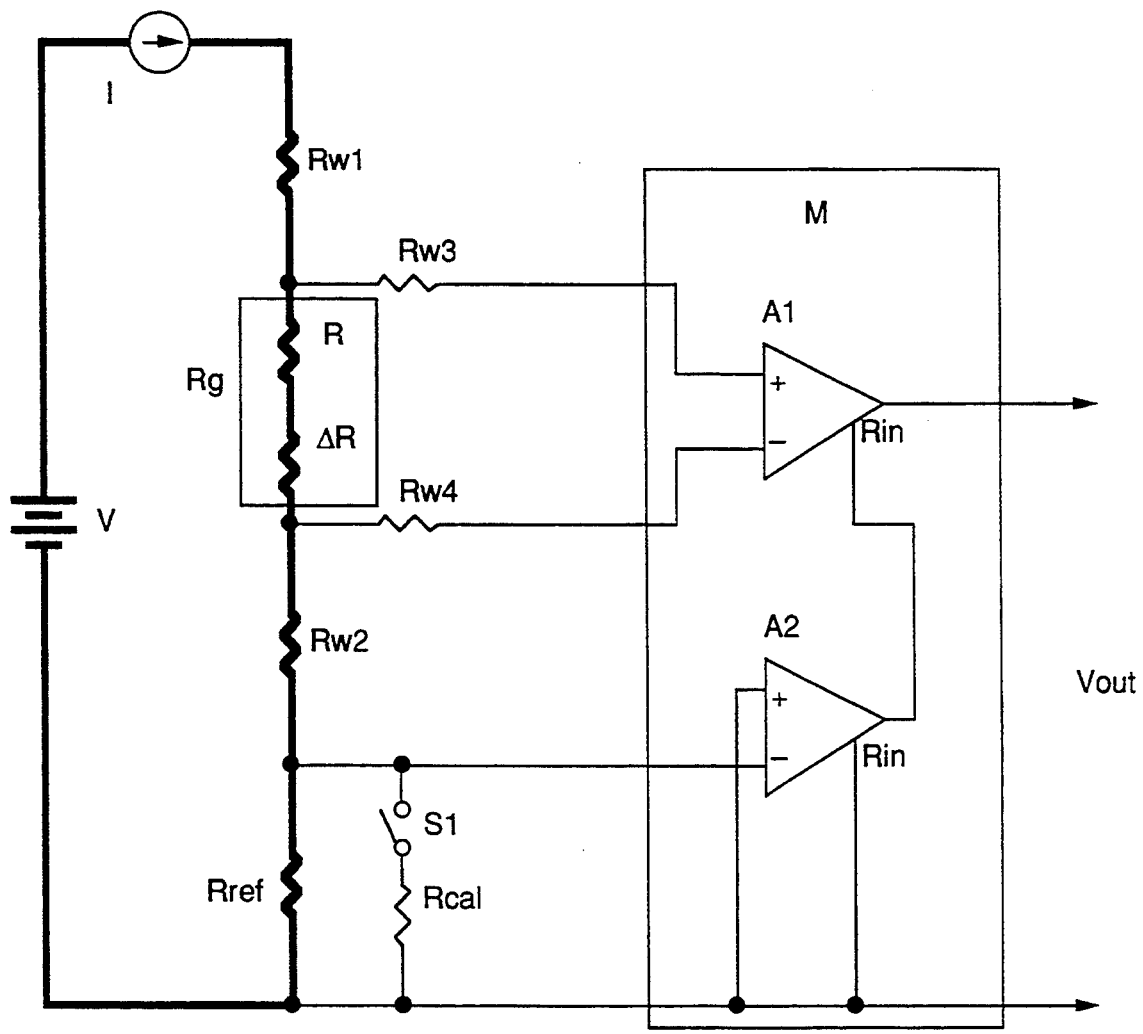
FIG. 5 is a schematic diagram of another embodiment of the voltage difference measuring system of the present invention using two instrumentation amplifiers.

Another embodiment of the voltage difference measuring system M is illustrated in FIG. 5. In this embodiment, two instrumentation amplifiers A1 and A2 are employed wherein the output of one of the instrumentation amplifiers A2 is coupled to the reference input terminal Rin of the other instrumentation amplifier A1 to form the difference output Vout.

Figure 6:
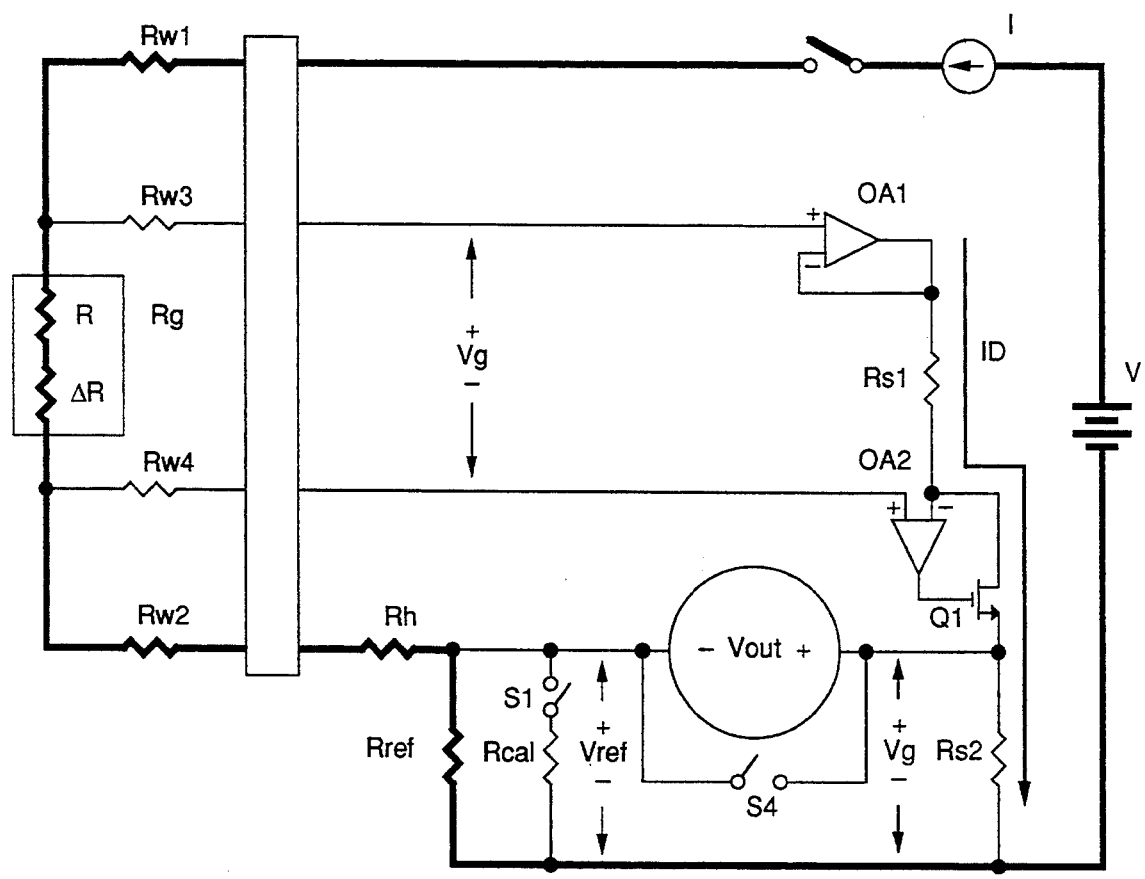
FIG. 6 is a schematic diagram of another embodiment of the voltage difference measuring system of the present invention using a data current generating circuit.

A fourth embodiment of the voltage difference measuring system is illustrated in FIG. 6. In this embodiment, high impedance operational amplifier OA1 draws no appreciable current from parasitic impedance Rw3 and operational amplifier OA2 draws no appreciable current from parasitic impedance Rw4 or resistor Rs1. Thus, voltage Vg appears across Rs1. Hence, a data current ID proportional to the voltage drop Vg across the transducer impedance Rg is generated. Resistor Rh (e.g. 100 ohms) provides a sufficient voltage (e.g. 1 V) at the gate of field effect transistor Q1 to maintain Q1 in its active range. Insulated gate field effect transistor Q1 acts with OA2 as a current regulator and enables ID to flow through Rs2 (Rs2=Rs1). Therefore, Vg appears across Rs2 and the output voltage Vout can be measured as a difference between Vref and Vg. Also, the output voltage Vout can be shorted by shorting switch S4 to check for common mode rejection problems or other electrical malfunctions in the device (e.g. voltmeter) used for measuring the output voltage Vout.

As shown in the above embodiments, the constant current measuring system of the present invention subtracts two independent voltages resulting from the same constant current independently of any parasitic voltages caused by parasitic resistances in the circuit. Hence, the output voltage is immune to the effect of the parasitic resistances in the circuit.

Although the preferred embodiment of this invention has been described, it will be obvious to those skilled in the art that various changes and modifications may be made therein without departing from the invention. Therefore, the claims are intended to include all such changes and modifications that fall within the true spirit and scope of the invention.

What is claimed is:

1. A constant current loop measuring system for measuring a characteristic of an environment comprising:
   a first impedance positionable in the environment;
   a second impedance coupled in series with said first impedance;
   a parasitic impedance electrically coupled to said first and second impedances;
   current means, electrically coupled in series with said first and second impedances, for providing a constant current through said first and second impedances to produce first and second voltages across said first and second impedances, respectively, and a parasitic voltage across said parasitic impedance; and
   voltage measuring means for measuring a voltage difference between said first and second voltages independent of said parasitic voltage to produce a characteristic voltage representative of the characteristic of the environment.

2. A constant current loop measuring system as claimed in claim 1, wherein said voltage measuring means comprises:
   first and second amplifying means for independently measuring said first and second voltages, respectively; and
   third amplifying means, electrically coupled to said first and second amplifying means, for differencing said first and second voltages to provide said characteristic voltage.

3. A constant current loop measuring system as claimed in claim 1, wherein said voltage measuring means comprises:
   flying capacitor multiplexing means, electrically coupled to said first and second impedances, for differencing said first and second voltages to provide a difference voltage; and
   first amplifier means, electrically coupled to said first impedance and said flying capacitor multiplexing means, for amplifying said difference voltage to provide said characteristic voltage.

4. A constant current loop measuring system as claimed in claim 1, wherein:
   said first impedance having a variable impedance that varies in accordance with the characteristic of the environment; and
   said constant current loop measuring system further comprises calibration means, operatively coupled to said current means, for calibrating said characteristic voltage in accordance with said variable impedance independently of said first, second and parasitic impedances.

5. A constant current loop measuring system as claimed in claim 4, wherein said calibration means comprises:
   a calibration impedance; and
   first switching means for electrically switching said calibration impedance in parallel with said second impedance.

6. A constant current loop measuring system as claimed in claim 1, further comprising first detecting means for detecting at least one of common mode voltages and induced voltages present in the constant current loop measuring system and an operating error of the voltage measuring means.

7. A constant current loop measuring system as claimed in claim 6, wherein:
   said voltage measuring means comprises:
      first and second terminals electrically coupled to said first impedance; and
      third and fourth terminals electrically coupled to said second impedance; and
   said first detecting means comprises second switching means for electrically coupling said first terminal to said second terminal and said third terminal to said fourth terminal.

8. A constant current loop measuring system as claimed in claim 1, further comprising second detecting means for detecting an operating error in said voltage measuring means.

9. A constant current loop measuring system as claimed in claim 8, wherein:
said voltage measuring means comprises:
first and second terminals electrically coupled to said first impedance; and
third and fourth terminals electrically coupled to said second impedance; and
said second detecting means comprises third switching means for electrically coupling said first terminal to said third terminal and said second terminal to said fourth terminal.

10. A constant current loop measuring system as claimed in claim 1, wherein said first impedance is one of a strain gauge and a temperature sensitive impedance.

11. A constant current loop measuring system for measuring a characteristic of an environment comprising:
a first impedance, positionable in the environment and having a variable impedance that varies in accordance with the characteristic of the environment;
a second impedance coupled in series with said first impedance;
a parasitic impedance electrically coupled to said first and second impedances;
current means, electrically coupled in series with said first and second impedances, for providing a constant current through said first and second impedances to produce first and second voltages across said first and second impedances, respectively, and a parasitic voltage across said parasitic impedance;
voltage measuring means for measuring a voltage difference between said first and second voltages independent of said parasitic voltage to produce a characteristic voltage representative of the characteristic of the environment, said voltage measuring means comprising:
first and second terminals electrically coupled to said first impedance; and
third and fourth terminals electrically coupled to said second impedance;
calibration means for calibrating said characteristic voltage in accordance with said variable impedance independently of said first, second and parasitic impedances, said calibration means comprising:
a calibration impedance; and
first switching means for optionally electrically coupling said calibration impedance in parallel with said second impedance;
first detecting means for detecting at least one of common mode voltages and induced voltages present in the constant current loop measuring system and an operating error of the voltage measuring means, said first detecting means comprising second switching means for electrically coupling said first terminal to said second terminal and said third terminal to said fourth terminal; and
second detecting means for detecting an operating error in said voltage measuring means, said second detecting means comprising third switching means for electrically coupling said first terminal to said third terminal and said second terminal to said fourth terminal.

12. A constant current loop measuring system as claimed in claim 11, wherein said voltage measuring means further comprises:
first and second amplifying means for independently measuring said first and second voltages, respectively; and
third amplifying means, electrically coupled to said first and second amplifying means, for differencing said first and second voltages to provide said characteristic voltage.

13. A constant current loop measuring system as claimed in claim 11, wherein said voltage measuring means further comprises:
flying capacitor multiplexing means, electrically coupled to said first and second impedances, for differencing said first and second voltages to provide a difference voltage; and
first amplifier means, electrically coupled to said first impedance and said flying capacitor multiplexing means, for amplifying said difference voltage to provide said characteristic voltage.

14. A constant current loop measuring system as claimed in claim 12, wherein said first impedance is one of a strain gauge and a temperature sensitive impedance.

15. A constant current loop measuring system as claimed in claim 13, wherein said first impedance is one of a strain gauge and a temperature sensitive impedance.

16. A constant current loop measuring system as claimed in claim 1, wherein said voltage measuring means comprises:
a first amplifier coupled to a first end of said first impedance;
a second amplifier coupled to a second end of said first impedance, said first amplifier having an output coupled to an input of said second amplifier;
a transistor coupled to an output of said second amplifier; and
a measuring impedance coupled to said transistor and said second impedance, said measuring impedance causing said characteristic voltage to be provided between a terminal of said transistor and said second impedance.

17. A constant current loop measuring system as claimed in claim 16, further comprising detecting means for detecting at least one of common mode voltages and induced voltages present in the constant current loop measuring system and an operating error of said voltage measuring means, said detecting means comprising means for electrically shorting said terminal of said transistor to said second impedance.

18. A constant current loop measuring system for measuring a characteristic of an environment, comprising:
a constant current loop including
a constant current source,
a first impedance operatively coupled to said constant current source,
a second impedance operatively coupled in series with said first impedance,
parasitic impedance electrically coupled to said first and second impedances;
first voltage sensor circuit operatively coupled across said first impedance;
second voltage sensing circuit operatively connected across said second impedance; and
a voltage subtracter operatively coupled to said first voltage sensing circuit and said second voltage sensing circuit.

* * * * *